(12) United States Patent
Itonaga

(10) Patent No.: US 9,887,226 B2
(45) Date of Patent: *Feb. 6, 2018

(54) SOLID-STATE IMAGING DEVICE

(71) Applicant: Sony Semiconductor Solutions Corporation, Kanagawa (JP)

(72) Inventor: Kazuichiro Itonaga, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/465,277

(22) Filed: Mar. 21, 2017

(65) Prior Publication Data

US 2017/0194369 A1   Jul. 6, 2017

Related U.S. Application Data

(63) Continuation of application No. 15/074,511, filed on Mar. 18, 2016, now Pat. No. 9,640,573, which is a (Continued)

(30) Foreign Application Priority Data

Dec. 5, 2005   (JP) ................................. 2005-351368

(51) Int. Cl.
  *H01L 27/146*   (2006.01)
(52) U.S. Cl.
  CPC .... *H01L 27/1463* (2013.01); *H01L 27/14607* (2013.01); *H01L 27/14614* (2013.01);
  (Continued)

(58) Field of Classification Search
  CPC .......... H01L 27/1407; H01L 27/14614; H01L 27/14636; H01L 27/14643; H01L 27/14689
  (Continued)

(56) References Cited

U.S. PATENT DOCUMENTS 7,217,601 B1   5/2007  Burke et al.
7,268,331 B2   9/2007  Koyama
(Continued)

FOREIGN PATENT DOCUMENTS

JP    2000-353801 A    12/2000
JP    2002-270808 A    9/2002
(Continued)

*Primary Examiner* — Marvin Payen
*Assistant Examiner* — Vernon P Webb
(74) *Attorney, Agent, or Firm* — Michael Best & Friedrich LLP

(57) ABSTRACT

An imaging device that includes a substrate, a photoelectric conversion section disposed in the substrate, an element isolation region disposed adjacent to the photoelectric conversion section, a floating diffusion electrically connected to the photoelectric conversion section, an amplification transistor having a gate electrode and an active region, and a contact section disposed on the gate electrode of the amplification transistor. The contact section overlaps the active region of the amplification transistor. The floating diffusion is electrically connected to the gate electrode of the amplification transistor via the contact section. The width of the gate electrode of the amplification transistor is larger than a width of the active region of the amplification transistor. The photoelectric conversion section includes a first type impurity, and the element isolation region includes a second type impurity having a conductivity opposite to the first type impurity.

12 Claims, 20 Drawing Sheets

Related U.S. Application Data continuation of application No. 13/939,980, filed on Jul. 11, 2013, now Pat. No. 9,318,523, which is a continuation of application No. 11/604,985, filed on Nov. 27, 2006, now Pat. No. 8,507,960.

(52) U.S. Cl.
CPC .. *H01L 27/14636* (2013.01); *H01L 27/14643* (2013.01); *H01L 27/14689* (2013.01)

(58) Field of Classification Search
USPC .................................................. 257/290–296
See application file for complete search history.

(56) References Cited

U.S. PATENT DOCUMENTS

| | | | |
|---|---|---|---|
| 7,560,754 B2 * | 7/2009 | Abe | ................... H01L 27/1463 257/222 |
| 9,318,523 B2 | 4/2016 | Itonaga et al. | |
| 9,640,573 B2 * | 5/2017 | Itonaga | ............. H01L 27/14614 |
| 2005/0064613 A1 | 3/2005 | Takeuchi et al. | |
| 2006/0169978 A1 | 8/2006 | Tatani et al. | |
| 2013/0264673 A1 | 10/2013 | Yoshihara | |

FOREIGN PATENT DOCUMENTS

| | | | |
|---|---|---|---|
| JP | 2003-218337 A | 7/2003 | |
| JP | 2005-197681 A | 7/2005 | |

* cited by examiner

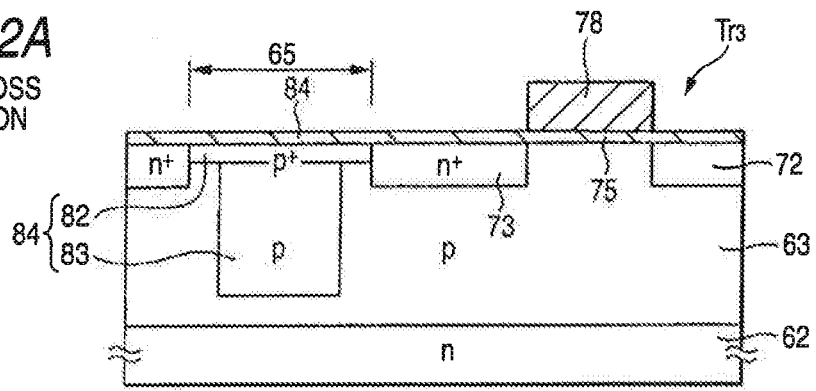
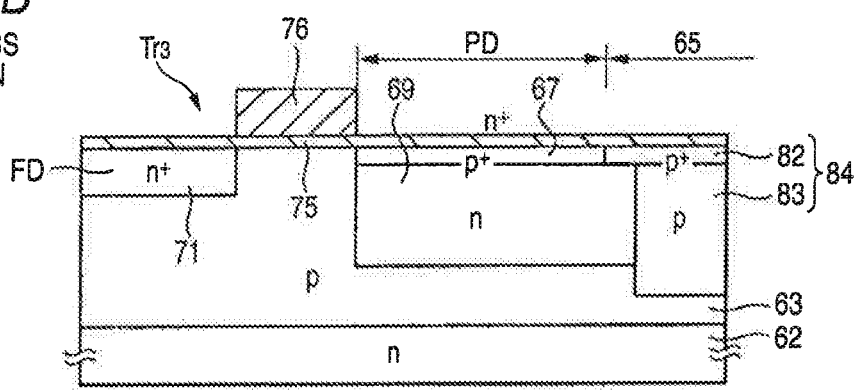
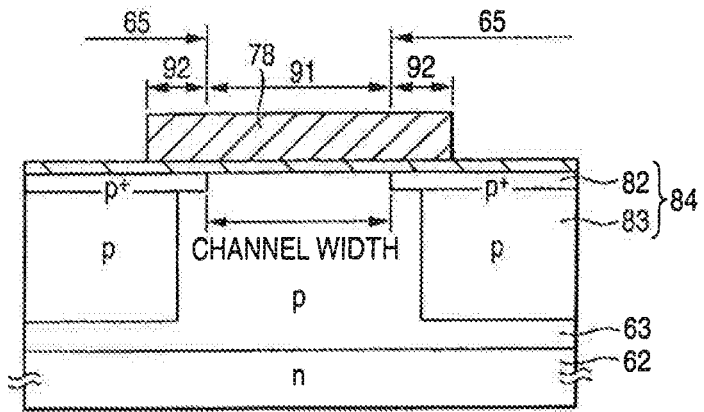

A-A CROSS SECTION

B-B CROSS SECTION

C-C CROSS SECTION

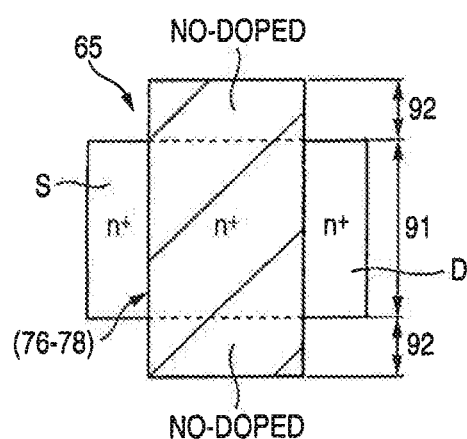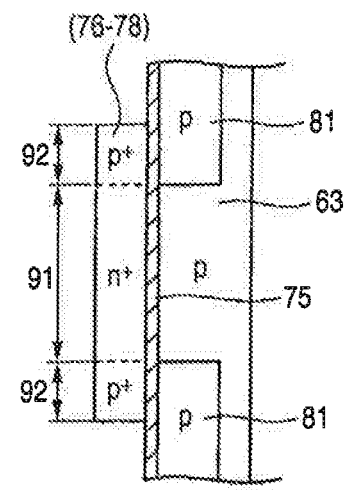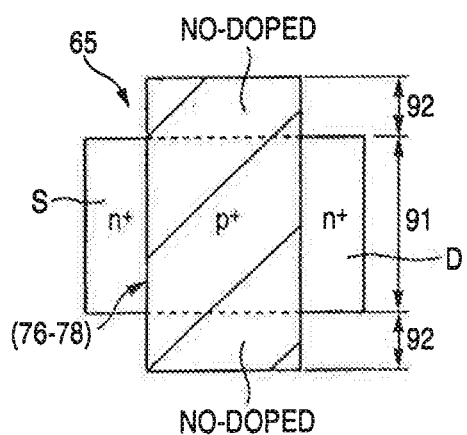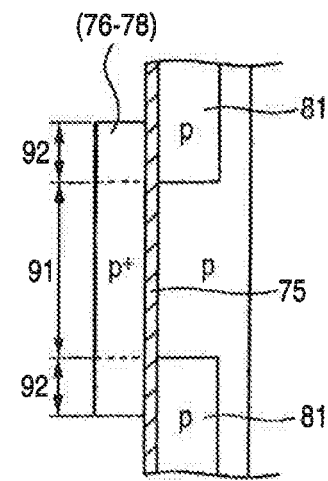

A-A CROSS SECTION

SOLID-STATE IMAGING DEVICE

CROSS REFERENCES TO RELATED APPLICATIONS

The present application is a continuation application of application Ser. No. 15/074,511, filed Mar. 18, 2016, which is a continuation application of application Ser. No. 13/939,980, filed on Jul. 11, 2013, now U.S. Pat. No. 9,318,523, issued Apr. 19, 2016, which is a continuation application of application Ser. No. 11/604,985, filed Nov. 27, 2006, now U.S. Pat. No. 8,507,960, issued Aug. 13, 2013, which claims priority to Japanese Patent Application JP 2005-351368 filed in the Japanese Patent Office on Dec. 5, 2005, the entire contents of which being incorporated herein by reference.

BACKGROUND OF THE INVENTION

1. Field of the Invention

The present invention relates to solid-state imaging devices and, more specifically, to a solid-state imaging device in which a pixel includes a conversion section that converts an electric charge generated by photoelectric conversion into a pixel signal, e.g., CMOS (Complementary Metal Oxide Semiconductor) sensor. The CMOS sensor is manufactured through entire or partial application of a CMOS process.

The solid-state imaging device may be a one-chip element, or configured by a plurality of chips.

2. Description of the Related Art

For MOS (Metal Oxide Semiconductor) devices, LOCOS (Local Oxidation of Silicon) isolation has been generally used for element isolation. In recent years, to deal with smaller device size, STI (Shallow Trench Isolation) is getting popular for element isolation.

In solid-state imaging devices such as CMOS sensors, STI is also getting popular for element isolation (refer to Patent Document 1 (JP-A-2002-270808)). A solid-state imaging device is configured by a pixel area, and a peripheral circuit that drives the pixel area for signal processing. The size reduction technology for the peripheral circuit is adopted also for the pixel area. For pixels in any recently-size-reduced solid-state imaging device, STI is also generally used for element isolation similarly to the peripheral circuit.

FIG. 24 shows the cross sectional configuration of the main section of a previous solid-state imaging device to which STI is applied. In this STI-applied solid-state imaging device 1, an n-type silicon substrate 2 is formed with a p-type semiconductor well area 3. The p-type semiconductor well area 3 is formed with a trench 4, and inside of the trench 4, a silicon oxide film 5 is embedded so that an STI area 6 is formed. This STI area 6 is an element isolation area that applies element isolation inside of a pixel and between any two adjacent pixels. With the STI area 6, two adjacent pixels 10A and 10B are isolated from each other, and in the pixels 10A and 10B, photodiodes PD or a plurality of transistors are also isolated from one another, for example. Note here that a pixel is configured by a photodiode PD serving as a photoelectric conversion section, and a plurality of transistors Tr.

The photodiode PD is of an HAD (Hall Accumulated Diode), configuration including the so-called n-type substrate 2, the p-type semiconductor well area 3, an n-type charge storage area 7, an insulation film 8 on the surface side, and a p+ accumulation layer 9. Out of a plurality of transistors, a transfer transistor is specifically configured by forming a transfer gate electrode 13. In the transfer gate electrode 13, a gate insulation film 12 is disposed between the n-type charge storage area 7 of the photodiode PD, and an n-type drain area 11 serving as a floating diffusion (FD). To the STI area 6, a p+ area 14 is formed at an interface among the deeply-embedded silicon oxide film 5, the n-type charge storage area 7, and the p-type semiconductor well area 3. The p+ area 14 is provided with the aim of preventing dark currents and white spots.

With the solid-state imaging device using the above-described STI as a technology of pixel area isolation, however, two problems are observed as below. The first problem is that a crystal defect easily occurs due to thermal stress. With the STI, the trench 4 is formed with a depth to the silicon substrate, and the silicon oxide film 5 is embedded therein so that the element isolation area 6 is formed. With such a configuration, there is indeed an advantage of forming a small-sized element isolation are, however, a difference of thermal expansion coefficient between the deeply-embedded silicon oxide film 5 and the silicon substrate causes the thermal stress. For improvement, some design change is made like the shape for STI is tapered, for example. With the tapered shape, however, the area of the photodiode PD is reduced, resulting in the fewer amount of saturation signal, and the poorer sensitivity.

The second problem is the p+ area 14 disposed between the silicon oxide film 5 in the trench 4 and the photodiode PD for the aim of preventing the dark currents and white spots. This P+ area 14 is required to have the impurity concentration of a level about the same as that of the p+ accumulation layer 9 on the surface of the diode PD. However, in terms of configuration, covering three-dimensionally the depth direction with sufficient concentration is difficult. What is more, because the p+ area 14 is formed in the initial stage, the p+ area 14 is expanded to the side of the photodiode PD due to the thermal diffusion. This resultantly reduces the area of the photodiode PD, thereby causing the reduction of the amount of saturation signal.

SUMMARY OF THE INVENTION

The applicant of the invention has proposed a solid-state imaging device to achieve improvement for the previous STI. FIG. 20 is a schematic diagram of a pixel viewed from the above, and FIG. 21 is a cross sectional view of the pixel of FIG. 20 cut along a line A-A. As shown in FIG. 20, in this solid-state imaging device 21, a pixel 22 is configured by a photodiode PD and a plurality of transistors Tr, and in this example, by three MOS transistors of a transfer transistor Tr1, a reset transistor Tr2, and an amplifying transistor Tr3. Note here that a reference numeral 36 denotes a gate electrode of the transfer transistor Tr1, a reference numeral 37 denotes a gate electrode of the reset transistor Tr2, and a reference numeral 38 denotes a gate electrode of the amplifying transistor Tr3.

As shown in FIG. 21, the pixel 22 is formed to a p-type semiconductor well area 24, which is formed to an n-type silicon semiconductor substrate 23, for example. The photodiode PD is formed by an n-type charge storage area 25 inside of the p-type semiconductor well area 24, and a p-type accumulation layer 26 on the surface thereof. The transfer transistor Tr1 is formed by an n-type charge storage area 25 of the photodiode PD, an n-type source/drain area (drain area in this example) 26, and a transfer gate electrode 36. The n-type source/drain area 26 serves as a floating diffusion (FD), and the transfer gate electrode 36 is formed via a gate insulation film 27. The reset transistor Tr2 is formed by, similarly, the n-type source drain area (drain area in this example) 26 inside of the p-type semiconductor well area 24, an n-type source/drain area (source area in this example) 39, and a gate electrode 37 formed via the gate insulation film. The amplifying transistor Tr3 is formed by, similarly, the n-type source/drain area (drain area in this example) 39 inside of the p-type semiconductor well area 24, a source/drain area (source area in this example) 40, and a gate electrode 38 formed via the gate insulation film. An element isolation area 31 is formed by a relatively-shallow p+ area 32, a relatively-deep p area 33, and a thick oxide film 35 formed on another thin oxide film 34 on the substrate.

In this example, to establish a contact between the gate electrode 38 of the amplifying transistor Tr3 and wiring, an extension section 38a of the gate electrode 38 is formed by being extended onto the insulation film 35 of the element isolation area 31. With this element isolation area 31, a diffusion layer takes charge of element isolation, and the element isolation area can be reduced in width while preventing white spots or dark currents from being caused by crystal defect. The photodiode can be thus large in area, and the saturation signal can be increased in amount. The element isolation area 31 is formed, on its surface, with the thick oxide film 35, and the extension section 38a of the gate electrode 38 is formed by being extended onto the oxide film 35. This thus prevents the formation of a parasitic MOS transistor in the pixel by the source area 40, the extension section 38a of the gate electrode 38, and the floating diffusion (FD) in the amplifying transistor Tr3 so that the normal sensor operation can be guaranteed.

With such an element isolation area 31, however, there is a possibility that the silicon substrate may be damaged, although slightly, when manufactured. As shown in FIGS. 22A to 23E, the semiconductor well area 24 of the silicon substrate is formed thereon with a silicon oxide film 24, and a silicon nitride film 43 in this order. After film formation as such, the silicon nitride film 43 is selectively removed from any target area for element isolation by dry etching, for example. As a result of such film removal, a concave section 44 is formed (refer to FIG. 22A). With dry etching, however, the silicon oxide film 34 being the base may be also etched a little, and the semiconductor well area 24 may be also suffered from damage on the surface, i.e., a damaged section 45.

Next, using the silicon nitride film 43 as a mask, a p-type impurity 47 is used for ion implantation, and a p+ area 32 is formed (refer to FIG. 22B). The p-type impurity has a relatively high concentration.

A silicon oxide film 48 is then formed, by CVD (Chemical-Vapor Deposition), on the surface of the silicon nitride film 43 including the concave section 44. A p-type impurity 49 is used this time for ion implantation so that the deep p area 33 is formed adjacent to the p+ area 32 (refer to FIG. 22C).

The silicon oxide film 50 is then embedded inside of the concave section 44 by CVD, and the surface is made flat by CMP (Chemical Mechanical Polish) or others (refer to FIG. 23D).

The silicon oxide film 48 is selectively removed together with the silicon nitride film 43 there below, thereby forming an insulation layer 35 only on the p+ area 32. As such, the element isolation area 31 is formed by the p area 32, the p+ area 33, and the insulation layer 35 (refer to FIG. 23E).

In the above manufacturing process, there is a possibility that the semiconductor well area 24 may be formed, on its surface, with the damaged section 45 although slightly by the etching process of FIG. 22A. The damaged section 45 is negligible under the current circumstances, however, if the solid-state imaging device to be equipped in mobile equipment, e.g., mobile phone, is increased in resolution, the existence of the damaged section 45 becomes not negligible, and will start affecting the properties. In the solid-state imaging device, the gate electrode of the transistor Tr of the pixel is connected with wiring. The gate electrode is generally connected to, i.e., made in contact with, wiring at the extension section 38a of the gate electrode 38 extending onto the element isolation area 31 if with the amplifying transistor Tr3, for example. With the element isolation configuration of FIG. 21, the extension section 38a of the gate electrode 38 is extended onto the insulation layer 35 of the element isolation area 31. The surface flatness is thus lost in terms of configuration, and the configuration becomes complicated.

It is thus desirable to provide a solid-state imaging device that has better characteristics than the previous type, e.g., the configuration is simpler, and white spots or others are observed less frequently.

According to a first embodiment of the invention, there is provided a solid-state imaging device that includes a pixel including a photoelectric conversion section, and a conversion section that converts an electric charge generated by photoelectric conversion into a pixel signal. In the solid-state imaging device, substantially only a gate insulation film is formed on a substrate corresponding to an area under a gate electrode of at least one transistor in the pixel.

With the solid-state imaging device of the first embodiment, substantially only a gate insulation film is formed on a substrate corresponding to an area under a gate electrode of a transistor, and the substrate includes a channel area and an element isolation area. With such a configuration, the gate electrode extending onto the element isolation area is formed also flat. That is, the element isolation area is not covered by a thick insulation layer.

Accordingly, unlike element isolation performed with any thick insulation layer, no damage is caused by etching so that generation of dark currents and white spots is prevented.

According to a second embodiment of the invention, there is provided a solid-state imaging device that includes: a pixel including a photoelectric conversion section and a conversion section that converts an electric charge generated by photoelectric conversion into a pixel signal. In the solid-state imaging device, a gate electrode of at least one transistor in the pixel includes a first section formed directly above a channel, and a second section formed on a substrate in the vicinity of the channel, and an impurity combination for implantation to the first section/the second section is any of p-type/no-doped, n-type/no-doped, n-type/p-type, and p-type/n-type.

With the solid-state imaging device of the second embodiment, an impurity combination for implantation is set as above between the first section directly above the channel of the gate electrode, and the second section extended onto the substrate in the vicinity of the channel. With such a setting, even if the first section directly above the channel of the gate electrode is applied with any needed gate voltage, the gate voltage is not applied to the second electrode extended onto the substrate in the vicinity of the channel. This accordingly stops the formation of a parasitic MOS transistor.

According to a third embodiment of the invention, there is provided an imaging apparatus that includes: a solid-state imaging part including a pixel with a photoelectric conversion section and a conversion section configured to convert an electric charge generated by photoelectric conversion into a pixel signal, wherein substantially only a gate insulation film is formed on a substrate corresponding to an area under a gate electrode of at least one transistor in the pixel; and a driving control part including a control section configured to control driving of the one transistor in the pixel included in said solid-state imaging part.

According to the solid-state imaging device of the embodiment of the invention, substantially only a gate insulation film is formed on a substrate corresponding to an area under a gate electrode of a transistor, and a gate electrode extending to the substrate, e.g., an element isolation area, does not extend onto an insulation film formed on the element isolation area. The surface thus can be made flat, and the configuration can be accordingly simplified.

What is better, the generation of dark currents and white spots is prevented better than a case of performing isolation with an insulation layer, for example, thereby improving the characteristics of the resulting solid-state imaging device.

BRIEF DESCRIPTION OF THE DRAWINGS

FIGS. 2A to 2C are cross sectional views of the solid-state imaging device of FIG. 1 cut along a line A-A, a line B-B, and a line C-C, respectively;

FIGS. 9A and 9B are a plan view and a cross sectional view, respectively, of still another exemplary gate electrode of the transistor;

FIGS. 10A and 10B are a plan view and a cross sectional view, respectively, of still another exemplary gate electrode of the transistor;

DETAILED DESCRIPTION OF THE INVENTION

In the below, embodiments of the invention are described by referring to the accompanying drawings.

Figure 1:
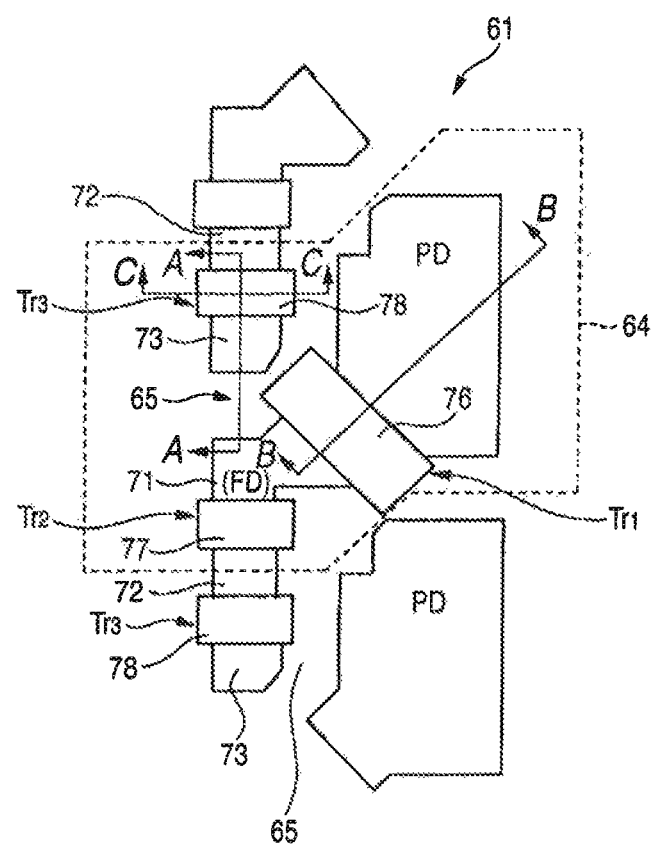
FIG. 1 is a plan layout diagram of a solid-state imaging device of a first embodiment of the invention.

FIGS. 1 to 2C show a solid-state imaging device of a first embodiment of the invention. FIG. 1 shows a plan layout of main components in a pixel area, and FIGS. 2A, 2B, and 2C are cross sectional views of the solid-state imaging device of FIG. 1 cut along a line A-A, a line B-B, and a line C-C, respectively.

A solid-state imaging device 61 of the first embodiment is provided with a semiconductor substrate of a first conductive type, e.g., n-type silicon substrate 62. This n-type silicon substrate 62 is formed with a semiconductor well area 63 of a second conductive type, e.g., p-type. On the p-type semiconductor well area 63, a photodiode PD and a unit pixel 64 configured by a plurality of transistors are each plurally disposed two-dimensionally on a regular basis. The photodiode PD serves as a photoelectric conversion section. Between any two adjacent unit pixels 64 or in each of the unit pixels 64, an element isolation area 65 is formed. The element isolation area 65 serves as element isolation means according to the invention.

The photodiode PD forms an HAD (Hall Accumulated Diode) sensor, including a p-type semiconductor area of a second conductive type, i.e., p+ accumulation layer 68, and an n-type charge storage area 69 of a first conductive type. The p+ accumulation layer 68 is formed at an interface between the surface of the silicon substrate and an insulation film 67. The n-type charge storage area 69 is formed below the p+ accumulation layer 68, and stores therein a signal charge as a result of photoelectric conversion.

The number of transistors configuring the pixel 64 varies, and in this example, used are three MOS transistors, i.e., a transfer transistor Tr1, a reset transistor Tr2, and an amplifying transistor Tr3. The transfer transistor Tr1 is formed by the charge storage area 69 of the photo diode PD, a source/drain area (drain area in this example) 71 of an n-type, i.e., first conductive type, and a transfer gate electrode 76. The n-type source/drain area 71 serves as a floating diffusion (FD), and the transfer gate electrode 76 is formed via a gate insulation film 75. The reset transistor Tr2 is formed by a pair of n-type source/drain areas (source area in this example) 71, an n-type source/drain area (drain area in this example) 72, and a reset gate electrode 77 formed via the gate insulation film 75. The amplifying transistor Tr3 is formed by a pair of n-type source/drain areas (drain areas in this example) 72, an n-type source/drain area (source area in this example) 73, and an amplifying gate electrode 78 formed via the gate insulation film 75.

Figure 3:
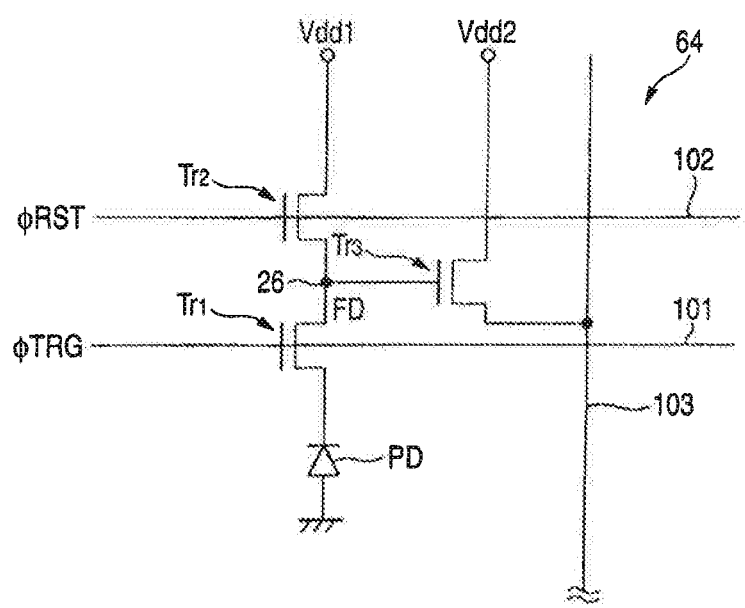
FIG. 3 is an equivalent circuit diagram of a unit pixel in the first embodiment.

FIG. 3 shows an equivalent circuit of the unit pixel 64. A cathode (n area) of the photodiode PD is connected to a gate of the amplifying transistor Tr3 via the transfer transistor Tr1. A node electrically connected to the gate of the amplifying transistor Tr3 is referred to as floating diffusion (FD). The transfer transistor Tr1 is connected between the photodiode PD and an FURO (FD). The transfer transistor Tr1 is turned on when the gate thereof is provided with a transfer pulse .phi.TRG via a transfer line 101, and transfers the signal charge as a result of photoelectric conversion by the photodiode PD to the floating diffusion (FD).

In the reset transistor Tr2, a drain is connected to a pixel power supply Vdd1, and a source is connected to a floating diffusion (FD). The reset transistor Tr2 is turned on when the gate thereof is provided with a reset pulse .phi.RST via a reset line 102, and resets the floating diffusion (FD) by getting rid of the electric charge of the floating diffusion (FD) to the pixel power supply Vdd1. Such resetting is made prior to the transfer of the signal charge from the photodiode PD to the floating diffusion (FD).

In the amplifying transistor Tr3, a gate is connected to a floating diffusion (FD), a drain is connected to a pixel power supply Vdd2, and a source is connected to a vertical signal 103. The amplifying transistor Tr3 forwards the potential of the floating diffusion (FD) to the vertical signal line 103 as a reset level. The potential to be forwarded is the one after the floating diffusion is reset by the reset transistor Tr2. The amplifying transistor Tr3 also forwards the potential of the floating diffusion (FD) to the vertical signal line 103 as a signal level. The potential to be forwarded is the one after the signal charge is transferred by the transfer transistor Tr1.

When the pixel is driven, the pixel power supply Vdd1 is affected and is switched between high and low in level, and the drain of the amplifying transistor Tr3 changes.

In the embodiment, the element isolation area 65 is configured by forming a p-type semiconductor area 81 inside of the p-type semiconductor well area 63. The p-type semiconductor area 81 is of a conductive type opposite to the first conductive type of the n-type source/drain areas 71 to 73 of the transistors. In this embodiment, the p-type semiconductor area 81 is formed by a p+ semiconductor area 82, and a p semiconductor area 83. The p+ semiconductor area 82 is of a high concentration, and is formed on the surface side of the semiconductor well area 63 with the relatively shallow depth. The p semiconductor area 83 is formed continuous to the p+ semiconductor area 82 with the depth needed for element isolation. The element isolation area of the p semiconductor area 81, i.e., the silicon substrate, is formed thereon with an insulation film 84 whose thickness is similar to that of the gate insulation film. The insulation film 84 on the element isolation film 65 is formed substantially by a gate insulation film 75 of the transistor. The element isolation area 65 is formed thereon with only the isolation film 84 equivalent to the gate insulation film 75. After the gate electrode is removed, the surface of the substrate carries thereon with only the gate insulation film so that the surface is made flat entirely including the active area of the transistor and the element isolation area.

Figure 15A:
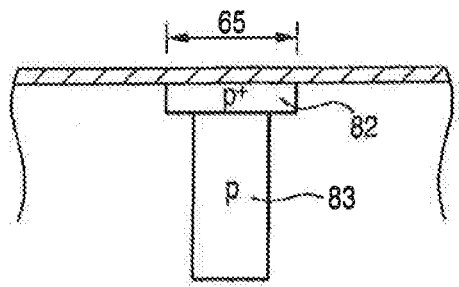
FIGS. 15A to 15E are all a schematic cross sectional view showing the configuration of an impurity area of an element isolation area in the embodiments of the invention.
Figure 15B:
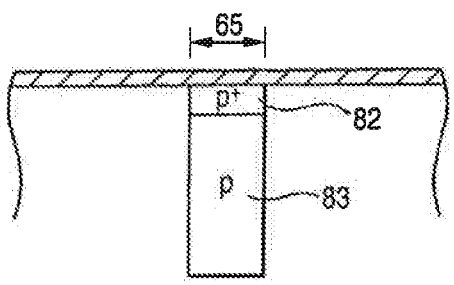
Figure 15C:
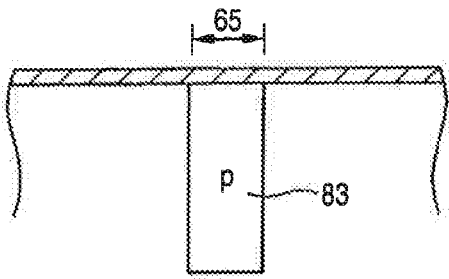
Figure 15D:
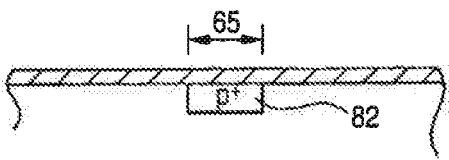
Figure 15E:
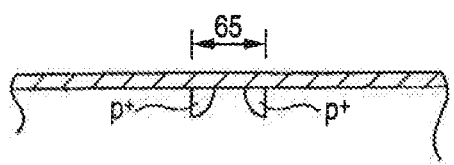

The impurity area 81 configuring the element isolation area 65 may take a configuration of FIG. 15A example, i.e., including the p+ impurity area 82 and the p impurity area 83 narrower in width than the area 82, a configuration of FIG. 15B example, i.e., including the p+ impurity area 82 and the p impurity area 83 sharing the same width, or a configuration of FIG. 15C, i.e., including only the p impurity area 83. The impurity area 81 configuring the element isolation area 65 may take a configuration of FIG. 15D example or that of FIG. 15E example. The configuration of the impurity area 81 of the element isolation area 65 is similarly applicable to other embodiments that will be described later.

The gate electrodes 76, 77, and 78 of the transistors Tr1, Tr2, and Tr3, respectively, each include first and second sections 91 and 92. The first section 91 corresponds to a channel area being an active area, and the second section 92 extends onto the substrate in the vicinity of the channel area, i.e., onto the element isolation area 65 in FIGS. 1 to 2C. As such, the substrate below the gate electrode is formed thereon only with the gate insulation film. In the drawing examples, the lower sections of the gate electrodes [76 to 78] of the element isolation area 65 are each formed by an insulation film, which is equivalent to the gate insulation film. In the first embodiment, the second section 92 may protrude a little from the gate electrode but is required to protrude as will be described later.

Figure 6A:
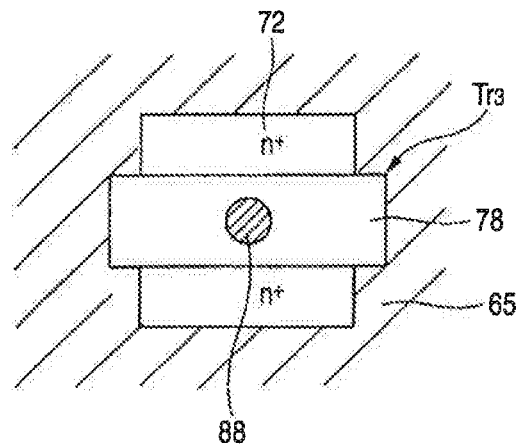
FIG. 6A to 6C are each a plan view of an exemplary contact section between a gate electrode and wiring.
Figure 6B:
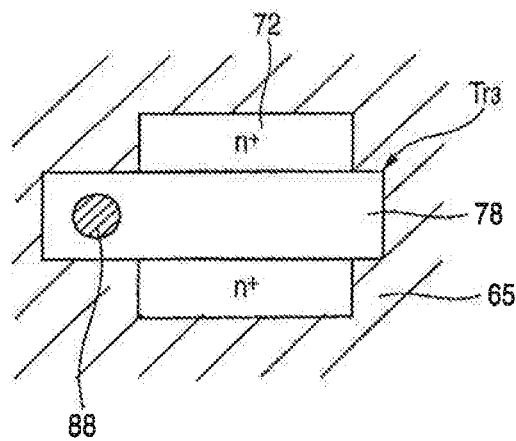

In the first embodiment, as shown in FIG. 6A, a contact section 88 that makes the gate electrodes [76 and 77] come in contact with the wiring [101 and 102] (refer to FIG. 3) is formed directly above the channel area. If with a solid-state imaging device, the components, i.e., the amplifying transistor, the reset transistor, and the transfer transistor, are basically analog. Therefore, compared with other transistors with a peripheral circuit, i.e., a so-called logic circuit, the gate electrodes of the above components are wider in width, thereby allowing contact with the gate electrodes directly above the channel. As shown in FIG. 6B, the contact section 88 that makes the gate electrodes [76 and 77] come in contact with the wiring [101 and 102] can be formed on the gate electrode protruding to the element isolation area 65.

With the contact section 88 formed directly above the channel area for making the gate electrodes [76 and 77] come in contact with the wiring [101 and 102], there is no more need for the area of the gate electrode for use to form the contact section outside of the channel, e.g., on the element isolation area 65. Accordingly, the photodiode PD or others can be larger in area, and the layout designing of the gate electrode becomes easier. Moreover, the second section 92 of the gate electrode is not required to protrude that much, thereby preventing the section from serving as a parasitic MOS transistor.

In the gate electrodes [76 to 78], the first and second sections 91 and 92 are made of different materials. That is, the gate electrode is made of polysilicon or amorphous silicon, i.e., polysilicon in this example, and impurity implantation is changed between the first and second sections 91 and 92. FIG. 7A to FIG. 10B show various types of examples. In the drawings, a reference character S denotes a source area, a reference character D denotes a drain area, and a reference numeral 65 denotes the element isolation area.

Figure 7A:
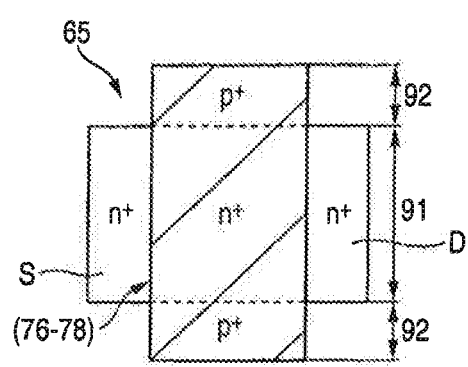
FIGS. 7A and 7B are a plan view and a cross sectional view, respectively, of an exemplary gate electrode of a transistor.
Figure 7B:
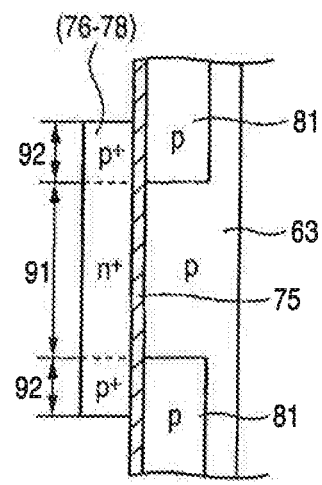

For example, as shown in FIGS. 7A and 7B, the first section 91 of the gate electrode [76 to 78] is formed by polysilicon with n-type impurity implantation, and the second section 92 is formed by polysilicon with p-type impurity implantation, i.e., the first section/the second section are of n-type/p-type.

Figure 8A:
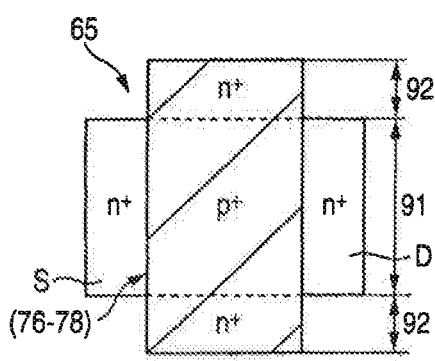
FIGS. 8A and 8B are a plan view and a cross sectional view, respectively, of another exemplary gate electrode of the transistor.
Figure 8B:
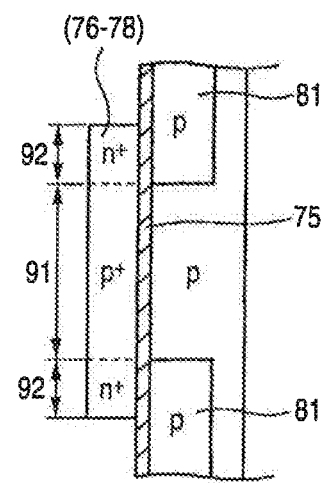

Alternatively, as shown in FIGS. 8A and 8B, the first section 91 is formed by polysilicon with p-type impurity implantation, and the second section 92 is formed by polysilicon with n-type impurity implantation, i.e., the first section/the second section are of p-type/n-type.

Still alternatively, as shown in FIGS. 9A and 9B, the first section 91 is formed by polysilicon with n-type impurity implantation, and the second section 92 is formed by no-doped polysilicon, i.e., the first section/the second section are of n-type/no-doped.

Still alternatively, as shown in FIGS. 10A and 10B, the first section 91 is formed by polysilicon with p-type impurity implantation, and the second section 92 is formed by no-doped polysilicon, i.e., the first section/the second section are of p-type/no-doped.

With such an impurity distribution in the gate electrodes [76 to 78], in any of the configurations of FIGS. 7A to 10B, when the transistors are driven through application of a predetermined gate electrode to the first section 91 formed directly above the channel, no gate voltage is applied to the second section 92 extending to the portion in the vicinity of the channel, e.g., the element isolation area 65. That is, in FIG. 7A to FIG. 8B examples, because a pn junction is formed at the boundary between the first and second sections 91 and 92, no gate voltage is applied to the second section 92 even if the first section 91 is applied therewith. In FIGS. 9A to 10B, the second section 92 is formed by no-doped polysilicon, and thus is high in resistance, serving substantially as insulator. Therefore, no gate voltage is applied to the second section even if the first section 91 is applied therewith. This thus prevents the formation of a parasitic MOS transistor with the second section 92 serving as a parasitic gate. With such a configuration, charge leaks are prevented from the channel to the portion there around, i.e., element isolation area, and the insulation film can be reduced in height between the gate electrodes [76 to 78] and the element isolation area 65. This insulation film can be formed only by a gate insulation film.

The first and second sections 91 and 92 are exemplarily formed as below. That is, a polysilicon film is deposited by CVD for patterning to a gate electrode pattern. As to the polysilicon film, the first and second sections 91 and 92 are entirely subjected to ion implantation of an n-type impurity, and then the second section 92 and the element isolation area are selectively subjected to ion implantation this time of a p-type impurity. This p-type impurity has the concentration that cancels out that of the n-type impurity. Alternatively, a polycrystalline silicon film may be entirely subjected to ion implantation of a p-type impurity, and then the second section 92 and the element isolation area may be selectively subjected to ion implantation this time of an n-type impurity. As a result, the first section 91 becomes conductive, and the second section 92 is formed as a high-resistance area. If the n-type and p-type impurities are of the same level, the impurities are cancelled out each other, thereby forming a no-doped area.

Figure 14:
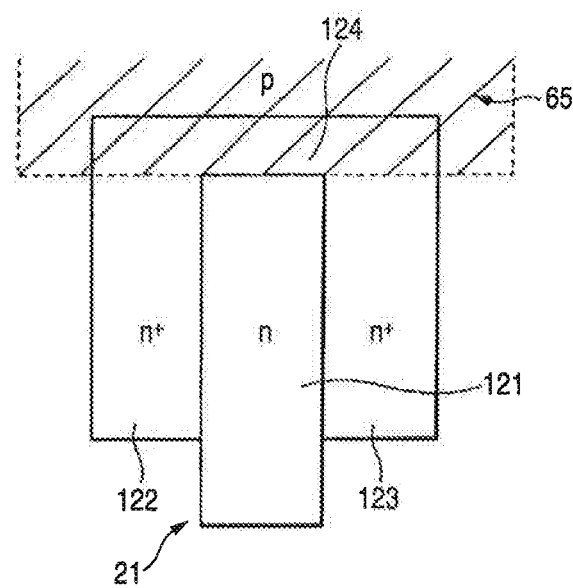
FIG. 14 is a plan view of main components for use for illustrating the second embodiment.

At this time, the gate electrode has to be extended onto the element isolation area even if a little. As shown in FIG. 14 example, considered here is a case with patterning displacements, i.e., a polysilicon film 121 serving as a gate electrode is formed more inward than end portions of a pair of n-type source/drain areas 122 and 123. With this being the case, with ion implantation of a p-type impurity, a p-type area 124 causes a short circuit between a pair of source/drain areas 122 and 123, whereby the transistor is not put into operation. In consideration thereof, the polysilicon film 121 of the gate electrode is preferably formed to protrude onto the element isolation area 65 even if a little.

Note that the length of the protrusion portion of the gate electrode on the element isolation area may take a value that allows the amount of a current leak at least between a pair of source/drain areas after ion implantation of a p-type impurity, and after various types of heat treatment. The recent study tells that even if a leak current is observed slightly between the source/drain areas 122 and 123 through the portion below the gate electrode of the element isolation area, it is negligible for the solid-state imaging device. That is, the solid-state imaging device is provided with a correlated double sampling circuit (CDS circuit) in a column signal processing circuit, and outputs a pixel signal with a difference between a reset signal and a signal of signal charge. Therefore, even with a slight leak current, the leak current is cancelled out by subtraction, and thus causes no effect.

In the above example of forming the first and second sections 91 and 92, the p-type impurity is used to form the boundary between the first and second sections of the gate electrode. If the first section of the gate electrode is subjected to ion implantation of a high-concentration n-type impurity for formation of the source/drain area, the n-concentration is increased to a further degree for the first section of the gate electrode. As such, even if some mask displacement is observed when the p-type impurity is used to form the boundary, ion implantation of the n-type impurity to the source/drain area enables to determine the channel width with accuracy.

As another example of forming the first and second sections 91 and 92, a no-doped polysilicon film is formed for patterning to a pattern of the gate electrode. Ion implantation of an n-type impurity is then performed to form the first section of the gate electrode at the same time with the source/drain area. With this method, there is no need to use the p-type impurity to form the boundary between the first and second sections.

Figure 16A:
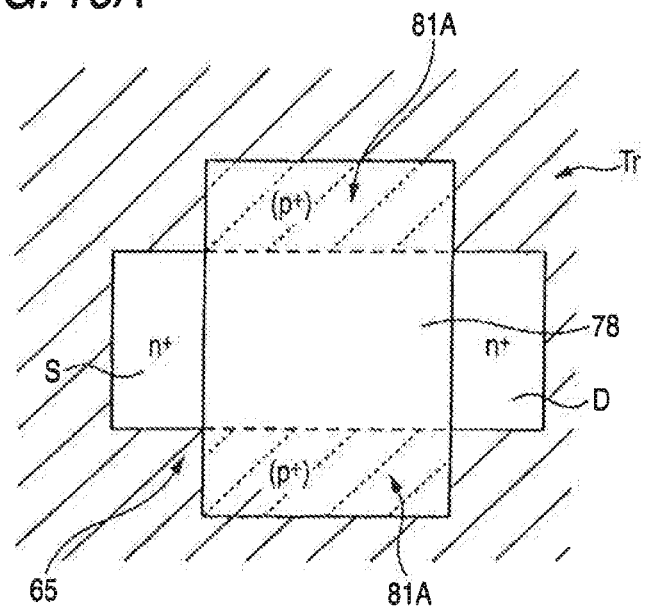
FIGS. 16A and 16B are each a plan view of main components of another embodiment of the invention.
Figure 16B:
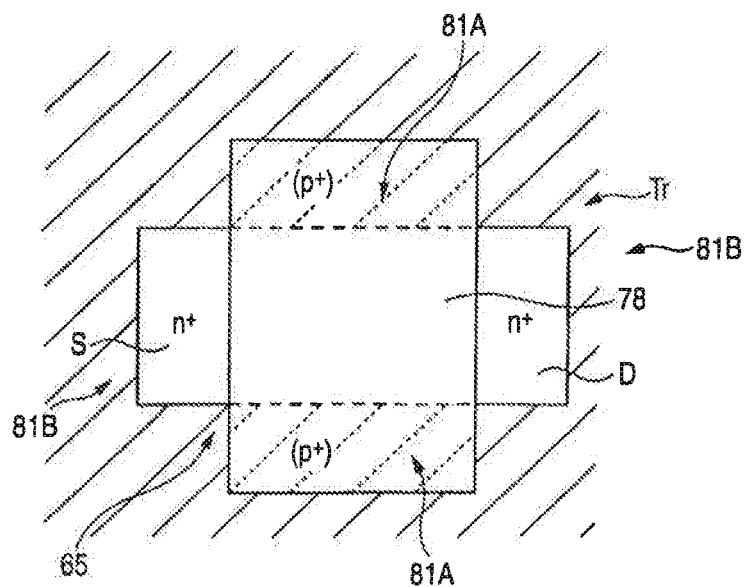

As shown in FIG. 16A, a section 81A in the vicinity of the channel of the gate electrode 78 of the transistor Tr, i.e., the element isolation area (hatched area by dotted lines), may be subjected to ion implantation of a p-type impurity to be a high-threshold-area. This is aimed for not to put the transistors in operation. As shown in FIG. 16B, the section (element isolation area) 81A in the vicinity of the channel of the gate electrode 78 may be configured to have an impurity concentration different from that of a section 81B, which is a portion (element isolation section) adjacent to the source S and the drain D, i.e., the section 81A has a higher concentration than the section 81B.

Figure 17:
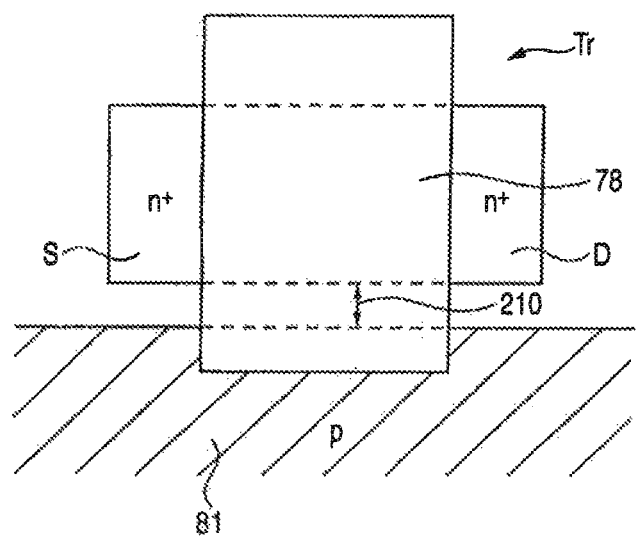
FIG. 17 is a plan view for use for illustrating another embodiment of the invention.

As shown in FIG. 17, considered now is a case of forming the impurity area 81 of the element isolation area 65 adjacent to the channel below the gate electrode 78 of the transistor Tr. At the time of such area formation, the impurity area 81 of the element isolation area 65 may be sometimes formed away from the channel area, i.e., so-called offset, due to mask displacement. Even if this is the case, when the transistor Tr is turned off, a negative voltage is applied to the gate electrode 78 so that a leak current can be prevented from occurring in an offset section 210.

Figure 11:
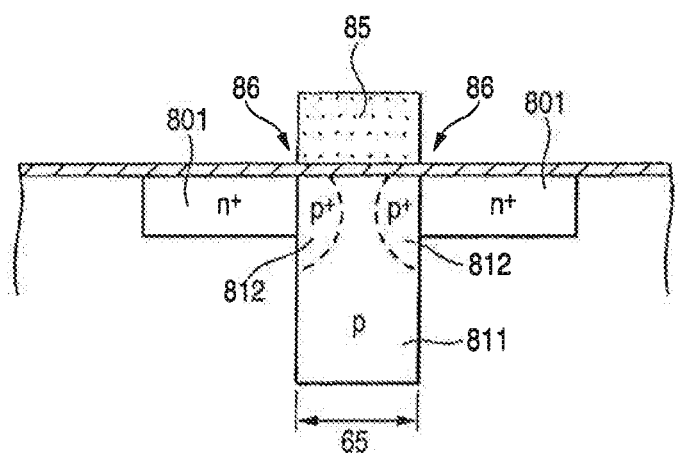
FIG. 11 is a cross sectional view of an exemplary impurity area of an element isolation area of the second embodiment.

As shown in FIG. 11, a second-conductive-type impurity area configuring the element isolation area 65, i.e., a p-type impurity area in this example, can be formed by a first p-type impurity area 811 and a second p-type impurity area 812. The second p-type impurity area 812 is formed inside of or adjacent to the first p-type impurity area 811, and has a higher concentration than the first p-type impurity area 811. To form the second p-type impurity area 812, the first p-type impurity area 811 is formed first, and a resist mask 85 is then formed on thus formed first p-type impurity area 811. Thereafter, angled ion implantation of a p-type impurity 86 will do.

As such, not only the first p-type impurity area 811 but also with the second p-type impurity area 812, element isolation can be performed with higher reliability.

Figure 12:
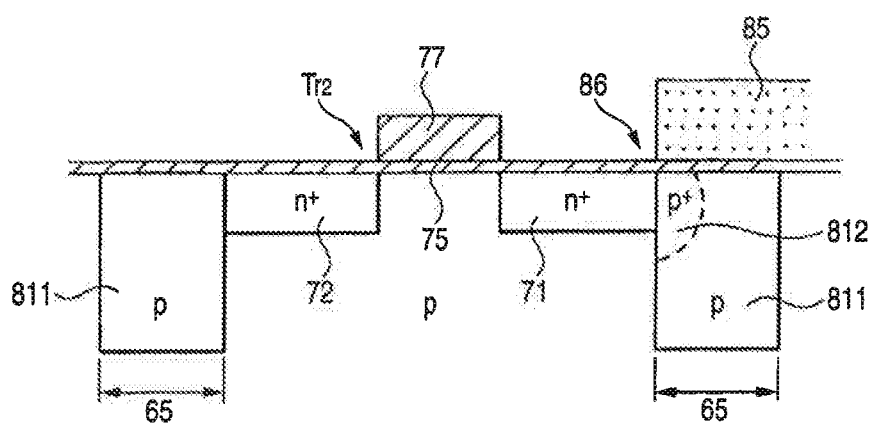
FIG. 12 is a cross sectional view of another exemplary impurity area of an element isolation area of the second embodiment.

As shown in FIG. 12, the second p-type impurity area 812 can be formed by angled ion implantation to the element isolation area 65 at least adjacent to the drain area of the transistor, i.e., the first p-type impurity area 811. The second p-type impurity area 812 especially helps element isolation to be performed to the drain-level-varying drain area with reliability. As an example, it is preferable to form the second p-type impurity area 812 to the element isolation area 65 adjacent to the drain area 71 of the reset transistor Tr2. This is because the drain area 71 of the reset transistor Tr2 is applied with the power supply voltage Vdd1 being high and low in level.

In FIG. 11 example, the first p-type impurity area 811 is not necessarily provided. In either case where the first p-type impurity area 811 is provided or not provided, the second p-type impurity area 812 may be formed to enclose the n-type area 801 including the bottom portion.

Similarly to FIG. 12 example, the second p-type impurity area 812 may be formed to enclose the source area 72 and the drain area 71 including their bottom portions.

Figure 13:
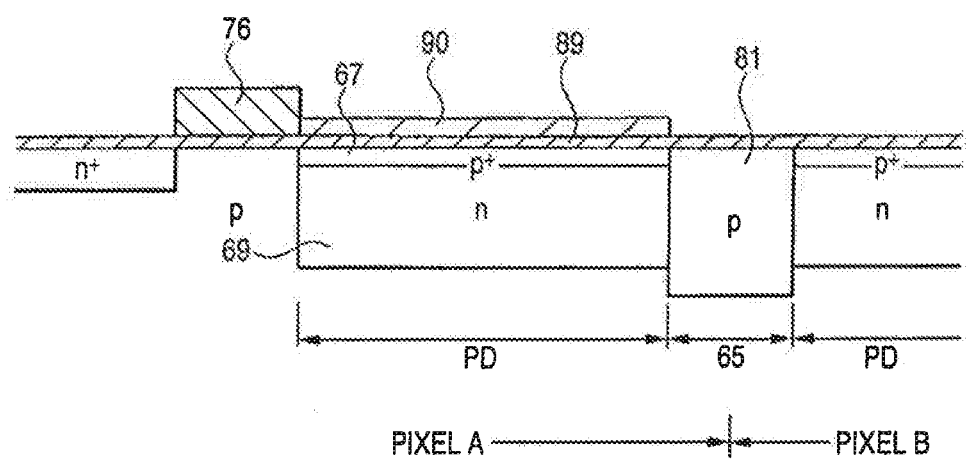
FIG. 13 is a cross sectional view showing exemplary configurations of main components on a photodiode formed with an anti-reflective film of the second embodiment.

As shown in FIG. 13, the photodiode PD is preferably configured with a thin silicon oxide film 89, in the drawing example, a gate insulation film and an anti-reflective film thereon, e.g., silicon nitride film 90. The silicon nitride film 90 is preferably formed thin to derive a better sensitivity for blue, and may be 1 to 10 nm in thickness, e.g., 5 nm. This anti-reflective film allows light to enter the photodiode PD with good efficiency.

According to the solid-state imaging device 61 of the first embodiment, an element isolation area below a gate electrode of at least any one of transistors Tr1, Tr2, and Tr3 in the pixel 64 is formed thereon only with the insulation film 84, i.e., substantially the gate insulation film, having the same thickness as the gate insulation film 75. In such a configuration, no insulation film is embedded like the previous STI configuration so that no dark current is caused by any defect due to selective etching.

With the previously-proposed diffusion layer isolation area, a thick insulation film is formed on the surface. Therefore, if a gate electrode is formed to extend onto the resulting element isolation area, there is a possibility that a polysilicon material used to form a gate electrode may be left on the portion of the thick insulation film. Further, the configuration will become complicated to deal with the smaller device size, e.g., the gate electrode is formed on the insulation film. In this embodiment, on the other hand, substantially the same gate insulation film covers also the element isolation area. Accordingly, no polysilicon material is left on the insulation film even after the gate electrode is formed, and the gate electrode is formed flat. This thus does not complicate but rather simplifies the surface configuration in the course of size reduction.

The element isolation area 65 is formed by the p-type impurity area 81 whose conductive type is opposite to that of the source/drain area of the transistor. This thus helps to prevent, without fail, a charge leak to adjacent pixels even if the element isolation area 65 is formed thereon only with the gate insulation film. What is better, element isolation on the p-type impurity area causes no etching damage like with STI or element isolation with a thick insulation film involved, thereby preventing generation of dark currents and white spots. The surface of the element isolation area 64 is high in concentration, and thus formation of a substantial parasitic MOS transistor is prevented even if the gate electrode is extended onto the element isolation area 65.

The p-type impurity area 81 is formed at least in the vicinity of the channel area of the transistor, i.e., the element isolation area. With such a configuration, no current flows in the vicinity of the channel area when the gate electrode of the transistor is changed in potential.

As shown in FIGS. 7A to 10B, in the gate electrodes (76, 77, and 78), ion implantation to the first section 91 directly above the channel, and the portion in the vicinity of the channel, i.e., the second section 92 on the element isolation area 65, may be performed with an impurity combination of n-type/p-type, p-type/n-type, n-type/no-doped, or p-type/no-doped, i.e., impurity distribution for the first section/the second section. This favorably achieves no gate voltage application to the element isolation area 65 even if the transistors are driven, and prevents a charge leak from the channel area to the element isolation area. This also reduces the height of the insulation film between the gate and the substrate, i.e., between the gate and the element isolation area, and makes the insulation film have the same thickness as the gate insulation film.

As shown in FIG. 11, as the p-type impurity area 81 configuring the element isolation area 65, in addition to the first p-type impurity area 811, the second p-type impurity area 812 is formed inside of or adjacent to the first p-type impurity area 811. Such a second p-type impurity area 812 helps to perform element isolation with more reliability.

As shown in FIG. 12, the second p-type impurity area 812 is formed to the element isolation area 65 adjacent to at least the transistor, i.e., the drain area 71 of the reset transistor Tr2 in this example. With such a configuration, isolation can be performed with reliability to the drain area in which the drain voltage, i.e., power supply voltage Vdd1, varies in level.

As shown in FIG. 6A, the contact section 88 making the gate electrode of the transistor come in contact with the wiring is formed directly above the channel area. With such a configuration, there is no more need for the area of the extension section of the gate electrode for use to form the contact section outside of the channel area. Accordingly, the light-receiving area of the photodiode PD can be increased so that the sensitivity increase can be achieved.

Figure 4:
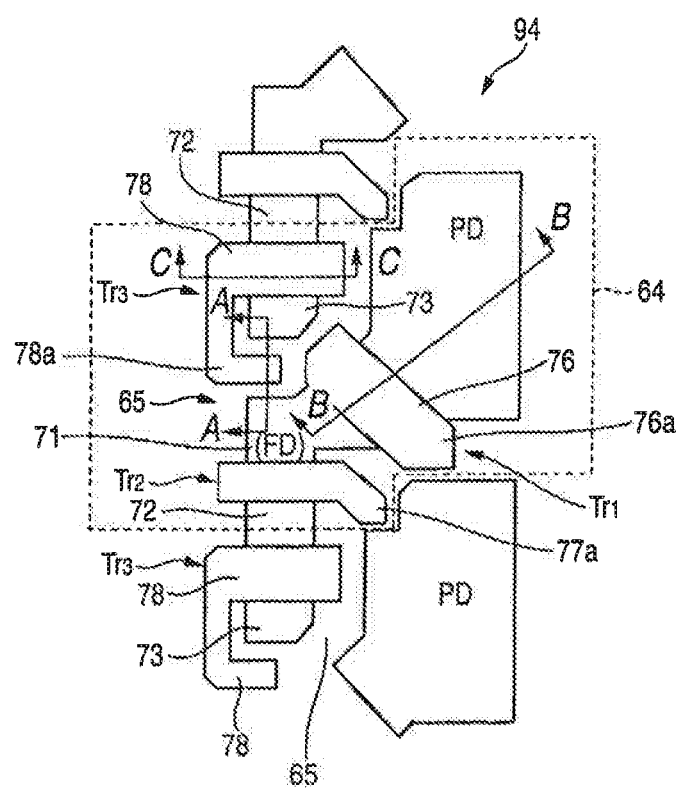
FIG. 4 is a plan layout diagram of a solid-state imaging device of a second embodiment of the invention.
Figure 5A:
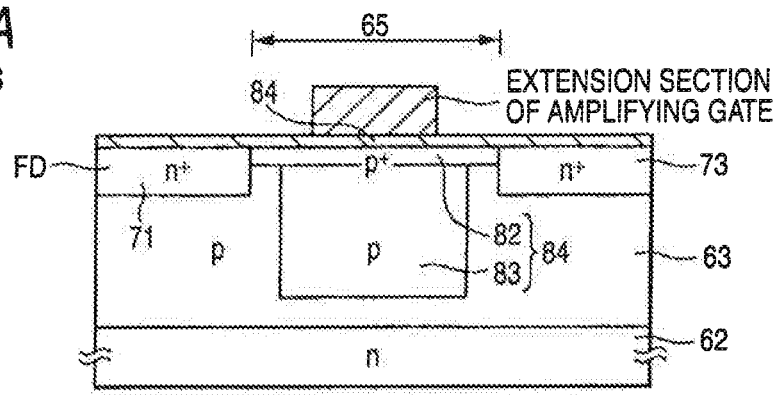
FIGS. 5A to 5C are cross sectional views of the solid-state imaging device of FIG. 4 cut along a line A-A, a line B-B, and a line C-C, respectively.
Figure 5B:
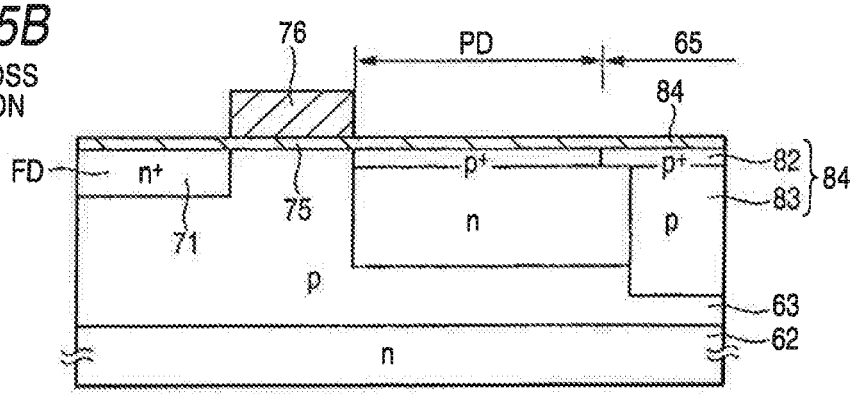
Figure 5C:
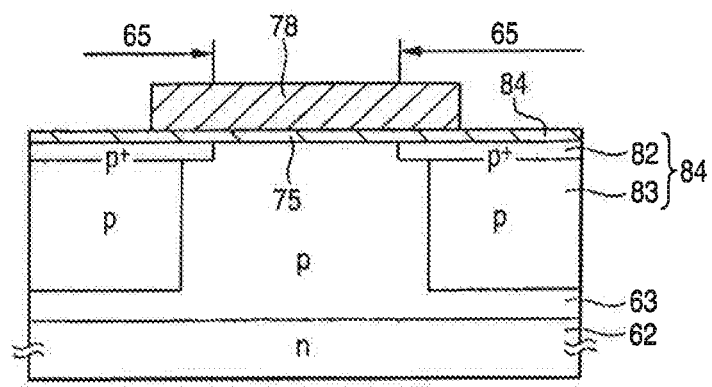

FIGS. 4 to 5C show a second embodiment of the solid-state imaging device of the embodiment of the invention. FIG. 4 is a plan layout diagram of main components of a pixel area, and FIGS. 5A to 5C are cross sectional views of the solid-state imaging device of FIG. 4 cut along a line A-A, a line B-B, and a line C-C, respectively.

A solid-state imaging device 94 of the second embodiment is similar to that in the first embodiment, except that the gate electrodes 76, 77, and 78 of the transistors Tr1, Tr2, and Tr3 have different patterns for plan layouts.

Figure 6C:
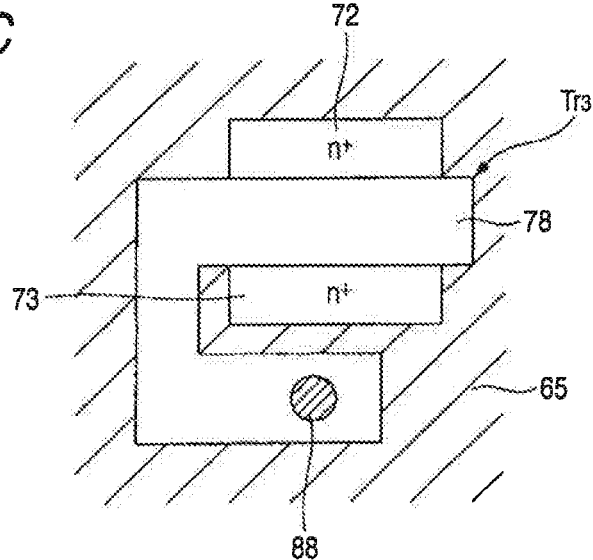

In the solid-state imaging device 94 of the second embodiment, the gate electrodes 76, 77, and 78 of the transistors Tr1, Tr2, and Tr3 are each partially extending onto the element isolation area 65 from directly above the channel area. The sections of the gate electrodes 76, 77, and 78, i.e., extension sections 76a, 77a, and 78a, form the contact section 88 that establishes a contact between the gate electrodes and wiring. In this example, the gate electrodes [76 to 78] and their extension sections [76a to 78a] are subjected to the implantation of impurity of the same conductive type, thereby being formed by a piece of conductive film. FIG. 6C is showing the contact section 88 that establishes a contact between the gate electrode 78 of the amplifying transistor Tr3 and wiring, for example.

The remaining configuration is similar to that of the first embodiment, and thus is not described again.

In the solid-state imaging device 94 of the second embodiment, as shown in FIG. 6B, the contact section 88 between the gate electrode and the wiring is formed to the extension section 78a of the gate electrode 78 that is an extension portion on the gate electrode in the vicinity of the channel area, i.e., element isolation area 65. The contact section 88 formed as such serves well not to affect the channel area even if any damage occurs at the time of forming the contact section. When there is any possibility of causing damage to the substrate at the time of forming the contact section, if the channel area is removed before contact establishing, the channel area can be protected from damage suffering.

Other effects, similarly in the first embodiment, include simplification of configuration, suppression of white spots and dark currents, prevention of parasitic MOS transistor formation, more reliable element isolation, and others.

Figure 21:
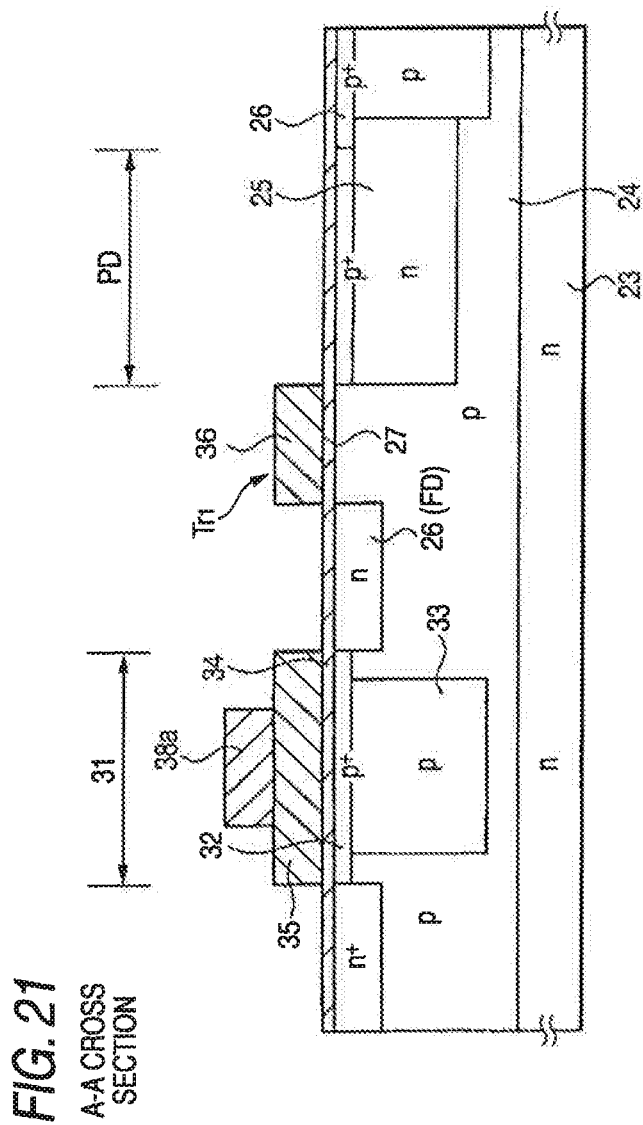
FIG. 21 is a cross sectional view of the solid-state imaging device of FIG. 20 cut along a line A-A.
Figure 22A:
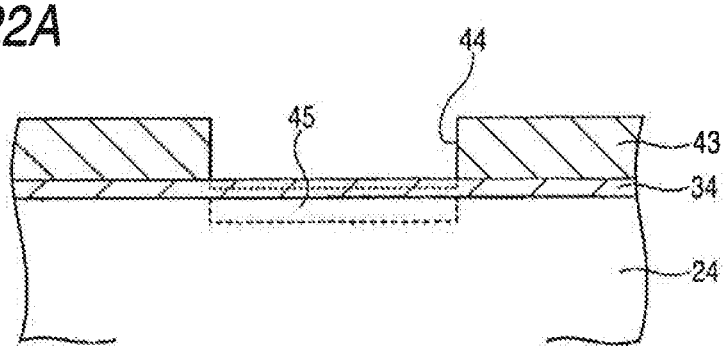
FIGS. 22A to 22C are each a first process diagram showing the formation process of an insulation layer of an element isolation area of the comparison example.
Figure 22B:
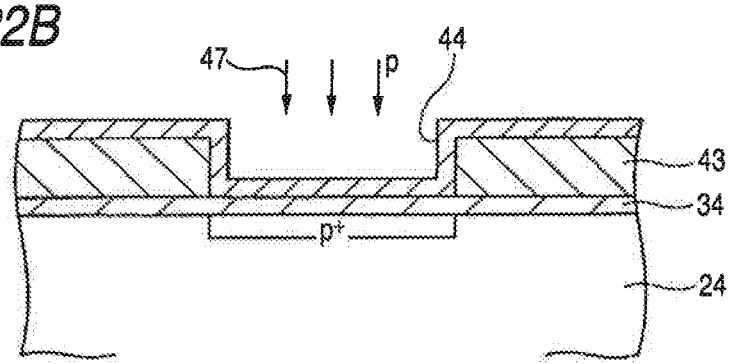
Figure 22C:
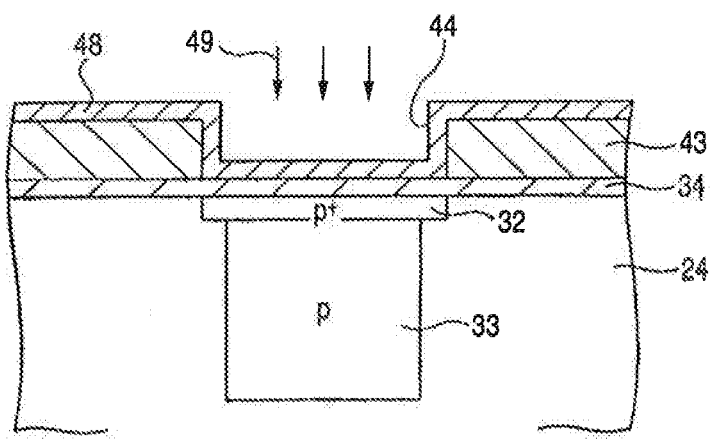
Figure 23D:
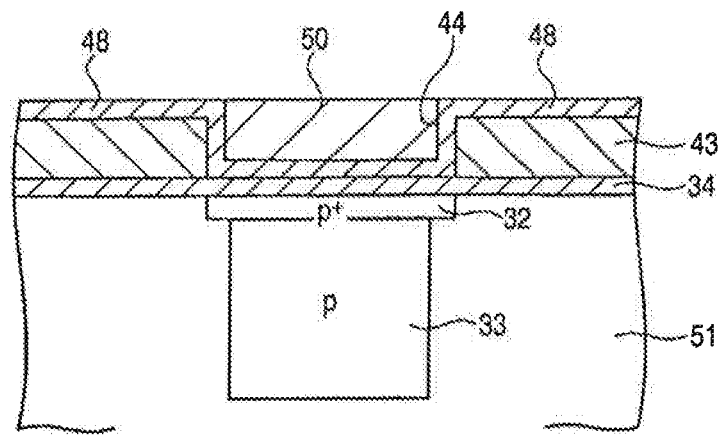
FIGS. 23D and 23E are each a second process diagram showing the formation process of the insulation layer of the element insulation area of the comparison example.
Figure 23E:
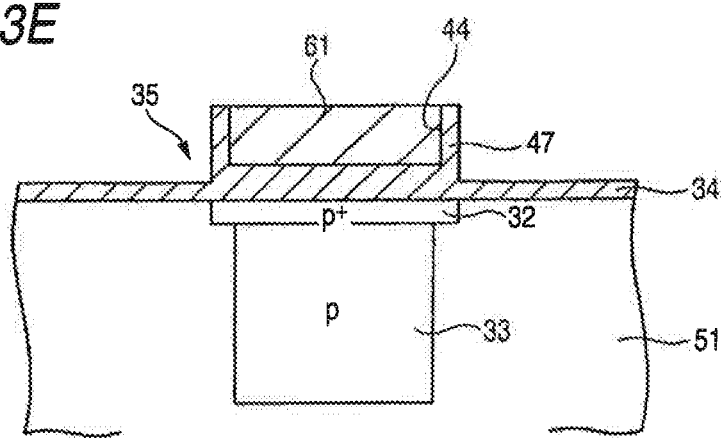
Figure 24:
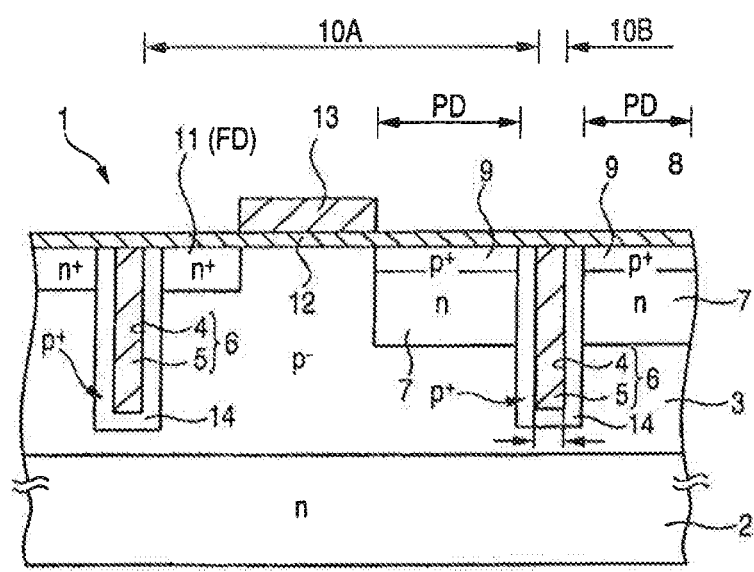
FIG. 24 is a cross sectional view of main components of a CMOS solid-state imaging device by previous STI.

As shown in FIG. 21, in the configuration of including a thick insulation film on an element isolation area, a gate electrode is formed on the insulation film. With such a configuration, when the device is reduced in size, there may be no enough space to establish a contact to the extension section corresponding to the element isolation area of the gate electrode. In the second embodiment, however, the gate electrode of the element isolation area is formed therebelow only with the gate insulation film, and the extension section of the gate electrode is formed flat. As such, even if the device is reduced in size, this extension section helps establish such a contact with ease.

Note that, in FIG. 5, the p semiconductor area 83 may not be necessarily provided in the element isolation area 65. If the p semiconductor area 83 is to be provided, the p-type area may be formed with the concentration of a level not to allow punch through. The p-type impurity at this time is controlled through ion implantation separately from the p-type semiconductor well area 63. This is applicable also to the configuration of FIG. 3.

As another exemplary configuration of the invention, in the embodiments described above, a pixel drive element, e.g., peripheral circuit, is provided outside of an imaging area that is formed with a plurality of pixels. The element isolation area of the pixel drive element is configured with an insulation film, which is different from the gate insulation film, below the gate electrode in the vicinity of the channel of the transistor.

According to this embodiment, with such a configuration of including an insulation film separately from the gate insulation film in the area for forming the pixel drive element, the element isolation can be performed with more reliability. What is more, by performing element isolation with the configuration of not including such a separately-formed insulation film but substantially only a gate insulation film below the gate electrode in the vicinity of the channel, many improvements can be achieved, i.e., contribute to correct any deficiency of the separately-formed isolation film caused by imaging areas with a higher pixel count, and by device size reduction. What is better, the configuration is less bumpy, thereby enabling to establish a contact with any flat electrode with ease. The area restrictions so far imposed on the contact section are thus reduced so that the space in the pixel can be effectively used.

Figure 18:
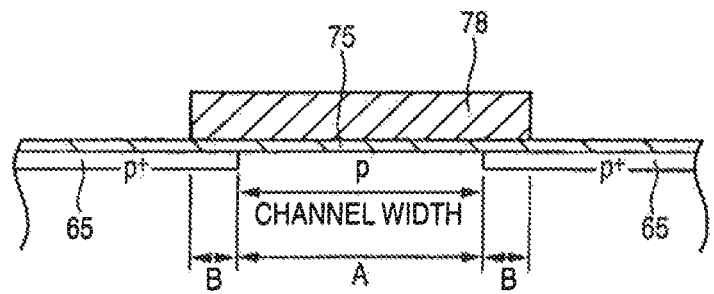
FIG. 18 is a cross sectional view for use for illustrating still another embodiment of the invention.

As another exemplary embodiment of the invention, FIG. 18 shows the cross sectional configuration of the gate electrode 78 of FIG. 6A, 6B, or 6C along the channel width direction. The gate electrode 78 is formed via the gate insulation film 75 in such a manner as to extend from the channel area (channel width) of the p well area 63 onto the p+ impurity area of the element isolation area. In FIG. 18, an area A corresponds to a channel area, and an area B corresponds to the element isolation area 65. At the time of such electrode formation, the area B (transistor) corresponding to the element isolation area 65 can be configured with a threshold value Vt2 higher than a threshold value Vt1 of the area A (transistor) corresponding to the channel area. If with such a configuration, the transistor of the area B barely exists because the performance capability thereof is lower than that of the transistor of the area A. As such, no substantial parasitic MOS transistor is formed.

Figure 19A:
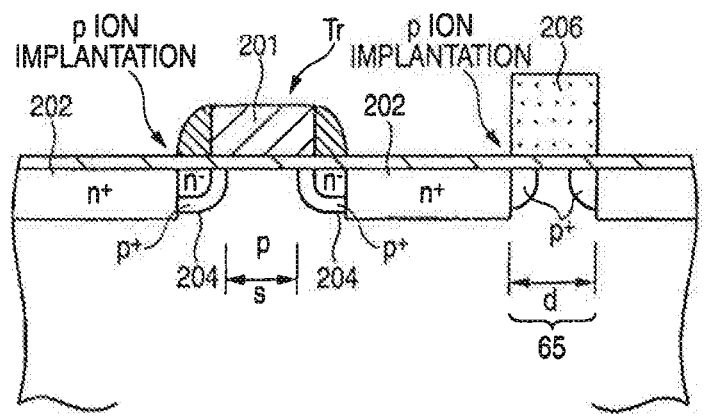
FIGS. 19A and 19B are each a cross sectional view of main components of still another embodiment of the invention.
Figure 19B:
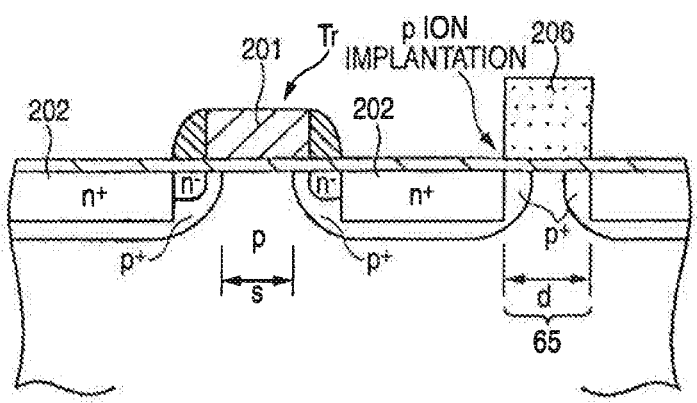
Figure 20:
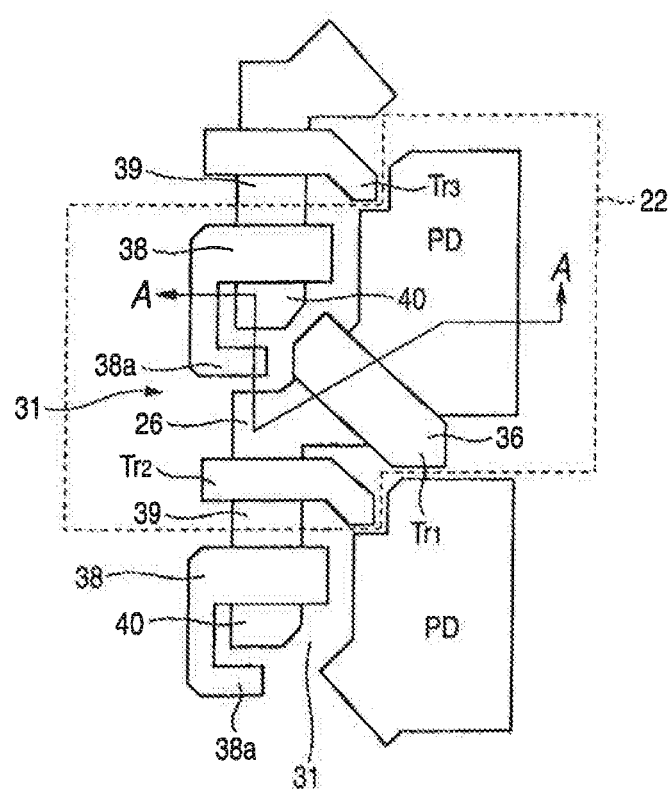
FIG. 20 is a plan layout diagram of a solid-state imaging device of a comparison example.

FIGS. 19A and 19B show still another embodiment of the invention. In this embodiment, an element isolation area is so configured as to include two impurity areas 205, which are formed by ion implantation from the side of two to-be-separated elements. That is, in FIGS. 19A and 19B, as the pixel is reduced in size, the channel length S directly below a gate electrode 201 of the transistor Tr1 is shorten. Therefore, the channel section adjacent to a source area 202 and a drain area 203 is formed with, locally, a p layer by angled ion implantation. With the same process as forming the p layer 204 by such angled ion implantation, two p areas 205 are formed to the element isolation area 65 by angled ion implantation via a resist mask 206. This thus prevents punch through between the source and the drain, and the element isolation area 65 can be formed with a narrower element isolation width d similarly to the channel lengths of the transistor Tr. As such, the size-reduced element isolation area 65 can be formed in a manner corresponding to the size reduction of the transistor.

The solid-state imaging device of the gate electrode configuration of FIGS. 7 to 10, i.e., of the impurity combination for implantation to the first section/the second section of the gate electrode, can be applied to other solid-state imaging devices with STI adopted for element isolation. As such, element isolation with STI can derive resistance with respect to Vg-Id characteristics (kink).

As still another embodiment of the invention, two or more impurity areas of p-type, n-type, or no-doped are formed in any one specific gate electrode, and in the electrode configuration forming a contact section to a first section corresponding on the channel section, the impurity areas are electrically connected to any boundary section of the areas (no-doped including), e.g., not to include metal silicide, metal, or any other conductive layers. That is, when a gate voltage of any needed level is applied to the gate electrode corresponding to the channel section, no gate voltage is applied to the gate electrode corresponding to the section in the vicinity of the channel, i.e., element isolation area.

In the above embodiments, the invention is applied to a solid-state imaging device in which a pixel is configured by a photodiode and three transistors. The number of the MOS transistors configuring a pixel in the solid-state imaging device is not restrictive to three, and any number will do as required, e.g., four transistors. The invention is also applicable to a solid-state imaging device in which the transistors, e.g., reset transistor and amplifying transistor, or with a selection transistor if with 4-transistor configuration, are shared by a plurality of photodiodes.

Figure 25:
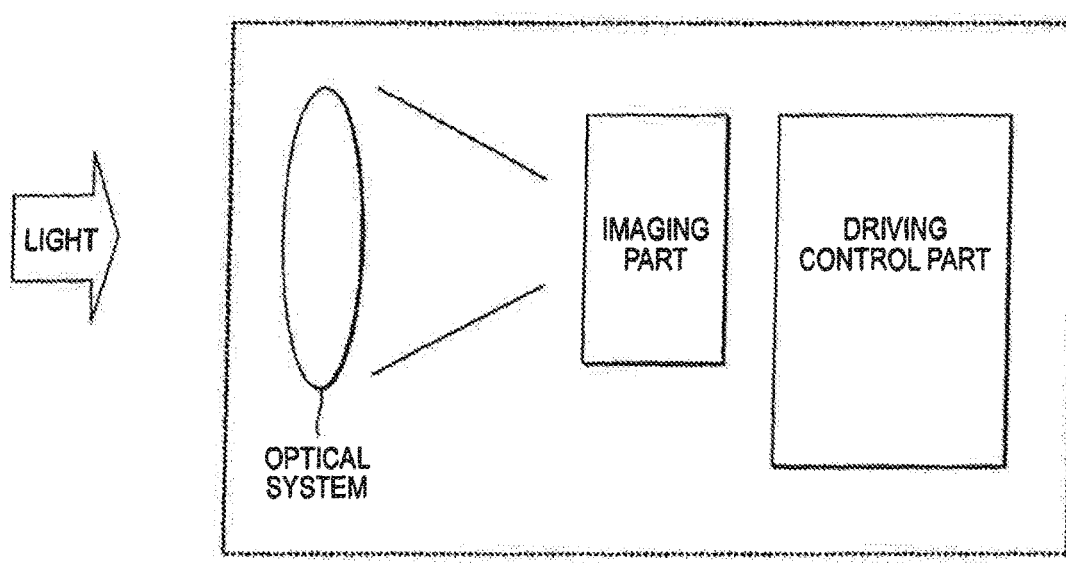
FIG. 25 is a schematic diagram of an imaging apparatus with an imaging part the present invention is applied.

The solid-state imaging device of the present invention is mounted in an imaging apparatus described in FIG. 25 like an electronic still camera, a cell phone or an FA (Factory Automation) camera. Implementation of the present invention in the device of the imaging apparatus leads to the improvements of the imaging quality of the imaging apparatus.

The solid-state imaging device of the present invention may be provided as an imaging module device in which a drive control circuit, a peripheral signal processing circuit or a power supply circuit is also installed.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device comprising:
   a substrate;
   a photoelectric conversion region in the substrate;
   an element isolation region adjacent to the photoelectric conversion region;
   a floating diffusion electrically connected to the photoelectric conversion region;
   an amplification transistor having a gate electrode and an active region; and
   a contact region at the gate electrode of the amplification transistor, the contact region overlaps the active region of the amplification transistor, wherein
   the floating diffusion is electrically connected to the gate electrode of the amplification transistor via the contact region,
   a width of the gate electrode of the amplification transistor is larger than a width of the active region of the amplification transistor,
   the photoelectric conversion region includes a first type impurity, and
   the element isolation region includes a second type impurity having a conductivity opposite to the first type impurity, and
   a drain region and a source region of the amplification transistor include the first type impurity.

2. The imaging device according to claim 1, wherein the second type impurity is a p-type impurity, and wherein the first type impurity is an n-type impurity.

3. The imaging device according to the claim 1, wherein the photoelectric conversion region is configured to generate a signal charge according to an amount of incident light.

4. The imaging device according to the claim 1, wherein the element isolation region is between the photoelectric conversion region and another photoelectric conversion region.

5. The imaging device according to the claim 1, wherein the element isolation region includes an insulating film over the substrate and an impurity region of the second type impurity under the insulating film.

6. The imaging device according to the claim 5, wherein the impurity region of the second type impurity has a first impurity region and a second impurity region.

7. The imaging device according to the claim 6, wherein the first impurity region is a p+ impurity region, and wherein the second impurity region is a p impurity region.

8. The imaging device according to the claim 6, wherein the first impurity region is a different shape from the second impurity region.

9. The imaging device according to the claim 6, wherein the first impurity region is above the second impurity region.

10. The imaging device according to the claim 6, wherein the second impurity region of the element isolation region is at least adjacent to a drain area of the amplification transistor.

11. The imaging device according to the claim 1, further comprising:
    a reset transistor having a gate electrode and an active region,
    wherein a width of the gate electrode of the reset transistor is larger than a width of the active region of the reset transistor.

12. The imaging device according to the claim 1, further comprising:
    a selection transistor having a gate electrode and an active region,
    wherein a width of the gate electrode of the selection transistor is larger than a width of the active region of the selection transistor.

* * * * *